United States Patent
Wang et al.

[11] Patent Number: 5,866,795
[45] Date of Patent: Feb. 2, 1999

[54] LIQUID FLOW RATE ESTIMATION AND VERIFICATION BY DIRECT LIQUID MEASUREMENT

[75] Inventors: Yen-Kun Wang, Fremont; Fong Chang, Los Gatos; Thanh Pham, San Jose; Jeff Plante, Pleasanton, all of Calif.

[73] Assignee: Applied Materials, Inc., Santa Clara, Calif.

[21] Appl. No.: 819,593

[22] Filed: Mar. 17, 1997

[51] Int. Cl.⁶ .................................................. G01L 25/00
[52] U.S. Cl. .............................................................. 73/1.36
[58] Field of Search .................................... 73/1.36, 1.16; 427/8

[56] References Cited

U.S. PATENT DOCUMENTS

| | | | |
|---|---|---|---|
| 4,358,947 | 11/1982 | Greene et al. | 73/1.31 |
| 5,419,924 | 5/1995 | Nagashima et al. | 427/248.1 |
| 5,520,969 | 5/1996 | Nishizato et al. | 427/8 |

*Primary Examiner*—Robert Raevis
*Attorney, Agent, or Firm*—Arnold, White & Durkee

[57] ABSTRACT

An apparatus for controlling the flow of a liquid precursor into a deposition chamber comprises a liquid injection system having a liquid injection outlet connected to a chamber inlet line upstream of the deposition chamber. The liquid injection system includes a liquid precursor supply, a purge gas supply, a carrier gas supply, a liquid flow meter, and a controller managing flows of the liquid precursor and carrier gas to the chamber. A purge line is connected between the purge gas supply and the liquid flow meter and is used to trap a known mass of liquid precursor. To calibrate the flow of the liquid precursor, the purge gas is used to push the trapped liquid precursor through the liquid flow meter at a steady rate. The elapsed time for evacuating the trapped liquid precursor from the purge line is measured. Calibration information is computed using the mass of the trapped liquid precursor and the measured elapsed time based on the direct liquid measurement approach. The calibration information is used to calibrate the controller to correct deviations in the liquid flow rate and achieve a target liquid precursor flow rate for improving wafer uniformity.

24 Claims, 4 Drawing Sheets

LIQUID FLOW RATE ESTIMATION AND VERIFICATION BY DIRECT LIQUID MEASUREMENT

FIELD OF THE INVENTION

This invention relates generally to the control of the flow of a liquid precursor into a process chamber for semiconductor processing, and more particularly to estimation and verification of a fluid control system using a direct liquid measurement technique.

BACKGROUND OF THE INVENTION

In a wafer fabrication process, a wafer is commonly subjected to process gases under pressure in the controlled environment of a process chamber. The deposition formation rate on the wafer and the etching removal rate from the wafer depend on the input gas flow rate of the process gases that enter the process chamber encapsulating the wafer.

A vapor deposition system for wafer fabrication generally includes a liquid delivery or injection system for vaporizing a liquid chemical and carrying the vaporized liquid into the deposition process or reaction chamber for wafer processing. A typical liquid delivery system for a chemical vapor deposition process manages the flow of a liquid precursor or reagent, a carrier gas, and one or more other process gases. The liquid precursor is delivered to a vaporization device at a steady flow rate. The carrier gas is delivered to the vaporization device for mixing with the vaporized liquid precursor. The other process gases are combined with the mixture of the vaporized liquid precursor and carrier gas for delivery to the process chamber.

A critical factor in the production of wafers with superior uniformity is the precise control of the flow rate of the delivery of the liquid precursor into the process chamber. Irregularities in the flow rate may cause nonuniformity and erroneous deposition film thickness that adversely affect wafer quality and acceptability. The liquid precursor flow rate is typically generated by a liquid mass flow controller that is governed electronically by a voltage signal, such as that produced in a liquid flow meter. The accuracy of the flow rate produced by the liquid mass flow controller depends on the calibration between the voltage signal and the actual flow rate delivered. Factory calibration of the liquid delivery system is generally approximate with a typical tolerance of up to 10%. Therefore, a flow rate adjustment technique is necessary to compensate for the imprecise factory calibration and to improve wafer uniformity and obtain proper deposition film thickness.

An estimation and verification methodology in U.S. Pat. No. 5,520,969 utilizes the steady state pressure differentials observed in the process chamber to compute a correction constant for controlling the mass flow rate of the liquid precursor. The steady state pressure differentials are obtained from a first pressure rise due to a flow of a carrier gas through the chamber and a second pressure rise resulting from a flow of the carrier gas injected with the vaporized liquid precursor (or vapor precursor) through the chamber.

Although the '969 patent offers a steady state methodology that is relatively simple and accurate compared to prior techniques that are based on measurements of transient parameters, the approach may produce inaccurate results and undesirable effects in the processing system. For instance, the process chamber may be contaminated by the gases (e.g., TEPO) used in the estimation and verification process, and the contamination may adversely affect the deposition process. Pressure sensors and flow control valves connected to the chamber for gas flow measurement and control may have defects or leaks that contribute to processing errors during deposition. In addition, the theoretical basis for the approach set forth in the '969 patent assumes that (1) the mixture of the precursor vapor and carrier gas behaves as an ideal gas; (2) complete vaporization of the precursor liquid; and (3) there is no condensation of the precursor vapor during its flow from the vaporizer to the chamber. The satisfaction of these assumptions ensures that the precursor vapor pressure is proportional to the precursor liquid flow rate. The departure from these assumption in actual experiments contributes to inaccuracies of the estimation and verification methodology.

SUMMARY OF THE INVENTION

There is therefore a need for an accurate and reliable estimation and verification methodology that overcomes the disadvantages of the prior art.

It is a feature of this invention to provide accurate and reliable estimation and verification without the need to flow gases into the process chamber and the need for the pressure sensors and valves connected to the chamber.

It is another feature of the invention to utilize computations that do not assume ideal gas behavior, complete vaporization of the liquid precursor, or non-condensation of the vapor precursor.

It is another feature of the invention to provide a methodology based on measurements that can be easily and accurately made.

It is yet another feature of the present invention to automate the estimation and verification methodology.

In accordance with one aspect of the present invention, a method for calibrating a liquid flow controller comprises the step of measuring an expected elapsed time for draining a mass of liquid through an inlet line connected to an inlet of a pre-calibrated liquid flow controller at an expected flow rate. An actual elapsed time is measured for draining the mass of liquid through the inlet line connected to an inlet of a liquid flow controller set at the expected flow rate. Calibration information is computed using the expected elapsed time and the actual elapsed time. The liquid flow controller is calibrated using the calibration information to achieve the expected flow rate of the liquid.

Another aspect of the invention is a method for calibrating a liquid flow meter in a precursor liquid injection system comprising the steps of trapping a liquid precursor with a mass in a tube having an outlet connected to an inlet of a liquid flow meter and supplying a purge gas to an inlet of the tube. The purge gas and the liquid precursor form a liquid-gas boundary therebetween. The liquid flow meter is set at an expected liquid precursor mass flow rate to release the trapped liquid precursor from the tube to flow through the inlet of the liquid flow meter with the liquid-gas boundary moving across the tube. An elapsed time is measured for the liquid-gas boundary to reach the inlet of the liquid flow meter. Calibration information is computed using the elapsed time and is used to calibrate the liquid flow meter.

Yet another aspect of this invention is a method for controlling the flow of a liquid precursor into a deposition process chamber, which comprises accumulating a liquid precursor in a line connected upstream to a liquid precursor controller. A purge gas is directed at a start time $t_0$ to drive the liquid precursor from the line through the liquid precursor controller at a liquid precursor flow rate. The liquid precursor is drained from the line at an end time $t_1$. Control data is generated from the start time and the end time. The liquid precursor flow rate is controlled to achieve an intended liquid precursor flow rate in response to the control data.

BRIEF DESCRIPTION OF THE DRAWINGS

The preferred embodiments of this invention, illustrating all their features, will now be discussed in detail. These embodiments depict the novel and nonobvious liquid flow rate estimation and verification apparatus and method of this invention shown in the accompanying drawings, which are included for illustrative purposes only. These drawings include the following figures, with like numerals indicating like parts.

DETAILED DESCRIPTION OF THE INVENTION

The present invention employs a direct liquid measurement approach to provide a method and an apparatus for liquid flow rate estimation and verification. The direct liquid measurement approach is illustrated in terms of a chemical vapor deposition system but may be applied to other environments for liquid flow rate estimation and verification.

A. Precision Liquid Injection Wafer Processing Apparatus

Figure 1:
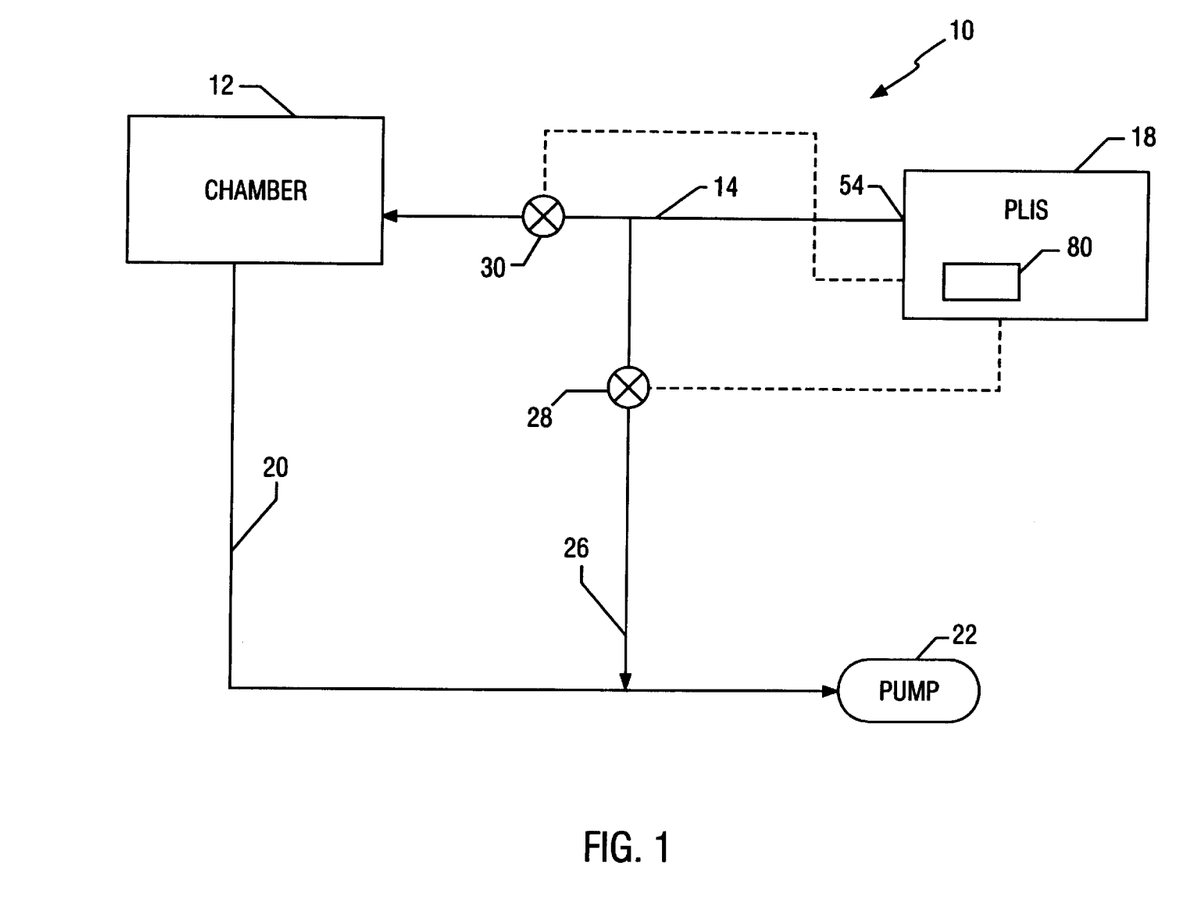
FIG. 1 is a schematic view illustrating a semiconductor wafer processing system of the present invention.

FIG. 1 shows a semiconductor wafer processing system 10 which includes a process chamber 12 that houses wafers (not shown). A chamber inlet line 14 supplies input gases produced from a liquid injection system 18 into the chamber 12. The chamber 12 releases the gases through a chamber outlet line 20 connected to a pump 22, which is desirably a vacuum pump that evacuates the chamber 12 and relieves chamber pressure during processing. A bypass line 26 desirably connects between the chamber inlet line 14 and the chamber outlet line 20 for bypassing the input gases when desired. A bypass valve 28 is desirably disposed along the bypass line 26. A chamber inlet valve 30 is advantageously disposed in the chamber inlet line 14 downstream from the location where the bypass line 26 intersects the chamber inlet line 14.

Figure 2:
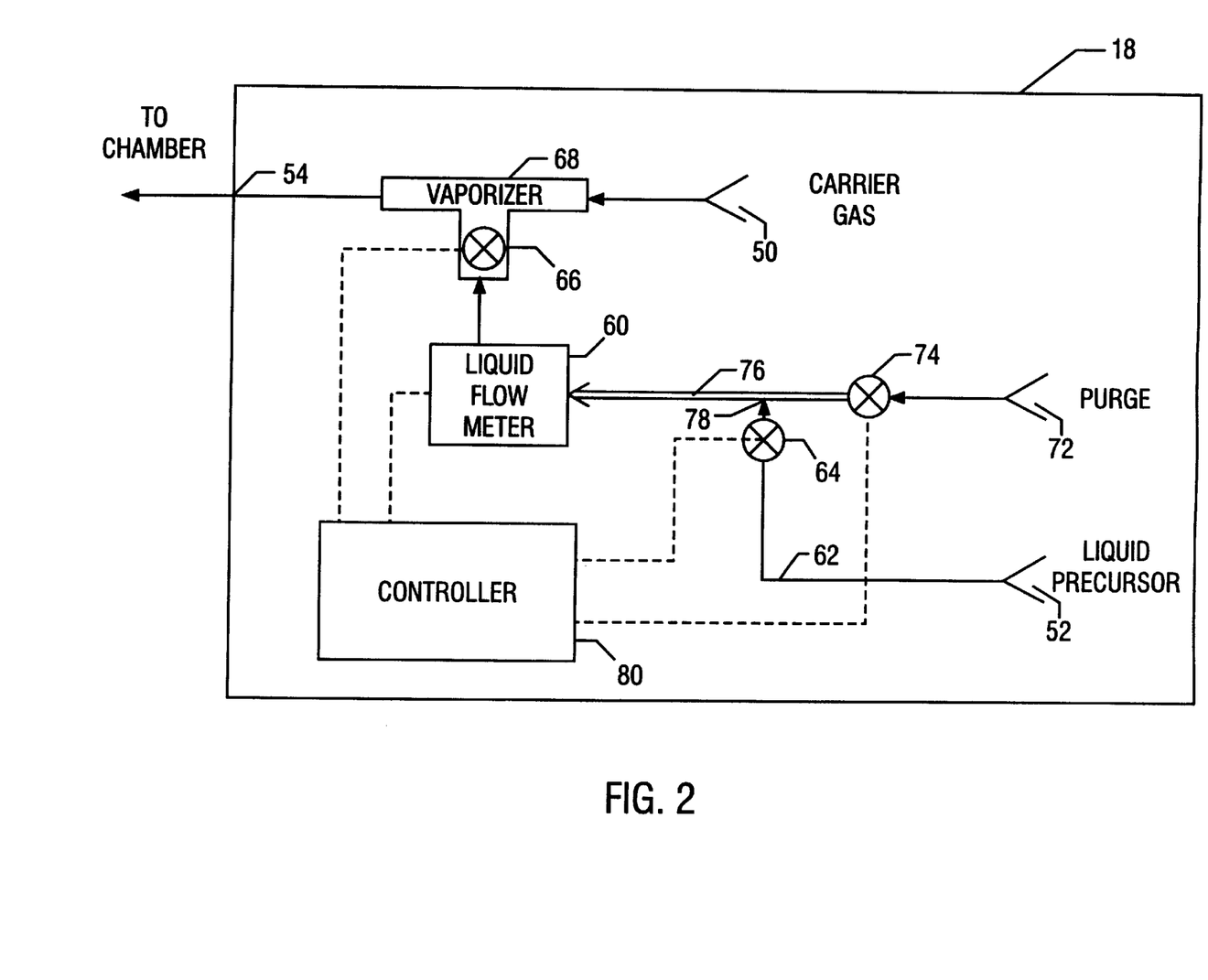
FIG. 2 is a schematic view illustrating a precision liquid injection system of the present invention.

FIG. 2 illustrates the liquid injection system 18, which comprises a carrier gas inlet 50 for supplying carrier gas, a liquid precursor inlet 52 for supplying a liquid precursor or reagent, and a liquid injection outlet or liquid injection system outlet 54 in communication with the chamber inlet line 14. The liquid precursor inlet 52 is desirably in communication with a liquid flow meter 60 through a liquid precursor inlet line 62 with a liquid precursor inlet valve 64 disposed therebetween. The liquid flow meter 60 preferably is a mass flow meter that feeds the liquid precursor through an injection control valve 66 to a vaporizer 68, which also receives the carrier gas from the carrier gas inlet 50 and communicates with the liquid injection system outlet 54. The injection control valve 66 is advantageously adjustable to vary the flow rate of the liquid precursor into the vaporizer 68. The liquid flow meter 60 serves dual purposes: it may be set at a desirable target liquid flow rate and also measures the liquid flow rate passing therethrough. A purge inlet 72 with a purge valve 74 is advantageously provided to communicate with the liquid flow meter 60 to supply a purge gas such as nitrogen to the liquid flow meter 60 through a purge line 76. The purge line 76 is desirably a straight pipe with a uniform cross-section that is circular. The liquid precursor inlet line 62 intersects the purge line 76 at an intersection 78. The liquid precursor inlet valve 64 is desirably disposed adjacent the intersection 78 of the purge line 76. The purge valve 74 is also desirably disposed adjacent the intersection 78. The valves 64, 74 may be any suitable valve, such as positive shut-off valves, and desirably have little to no dead volume. The valve 66 may be any suitable control valve, such as a solenoid or piezo control valve.

A controller 80 is advantageously provided to manage the flow circuit of the processing system 10. The controller 80 may be any suitable flow regulating device that advantageously includes a processor such as a computer processor for generating, receiving, and processing the signals automatically (not shown). The controller 80 desirably communicates with the chamber inlet valve 30 and bypass valve 28 to manage the direction of the gas flow from the liquid injection system outlet 54 by sending signals such as voltages to the valves. The controller 80 communicates with the purge valve 74, liquid precursor inlet valve 64, and injection control valve 66 to manage the flow of these fluids into the vaporizer 68. The controller 80 may also communicate with the carrier gas, liquid precursor, and purge gas supplies (not shown) to maintain constant flow rates for each fluid.

The controller 80 advantageously communicates with the liquid flow meter 60 to receive the liquid flow meter setting and adjusts the injection control valve 66 accordingly to achieve the target liquid flow rate. The controller 80 also receives the liquid flow rate measurement data from the liquid flow meter 60 and adjusts the injection control valve 66 based on the measured data in a feedback loop until the measured liquid flow rate matches the liquid flow meter setting in the liquid flow meter 60.

The components of the processing system 10, including those of the liquid injection system 18, are commercially available with a wide selection and known in the art. For instance, the vaporizer 68 may be of the type that utilizes the carrier gas to vaporize the liquid precursor such as that discussed in U.S. Pat. No. 5,419,924, which is hereby incorporated by reference.

B. Direct Liquid Measurement Calibration Methodology

The present method measures the liquid flow rate directly for a precursor liquid contained or trapped in the purge line 76. For a known volume (V) of the purge line 76 and density of the liquid precursor ($\rho$), the mass (M) of the liquid precursor with a volume (V) equal to that of the purge line 76 is $$M = \rho V. \tag{1}$$

A volume V of the liquid precursor is trapped in the purge line 76 when the purge valve 74 is closed and the liquid precursor inlet valve 64 is opened to flow the liquid precursor through the purge line 76 and the liquid flow meter 60 to the vaporizer 68. Assume that the liquid precursor is released to the carrier gas flow stream at a start time $t_0$ and the controller 80 adjusts the injection control valve 66 accordingly to the liquid mass flow rate setting $Q_e$ of the liquid flow meter 60. The liquid mass flow measurement of the liquid flow meter 60 goes through a short transient period and reaches a steady state liquid mass flow rate $Q_a$ which may deviate from the setting $Q_e$ due to system inaccuracies such as the inaccuracy of the liquid flow meter 60, as shown in the plot of IS mass flow rate (i.e., current) versus time in FIG. 3.

Figure 3:
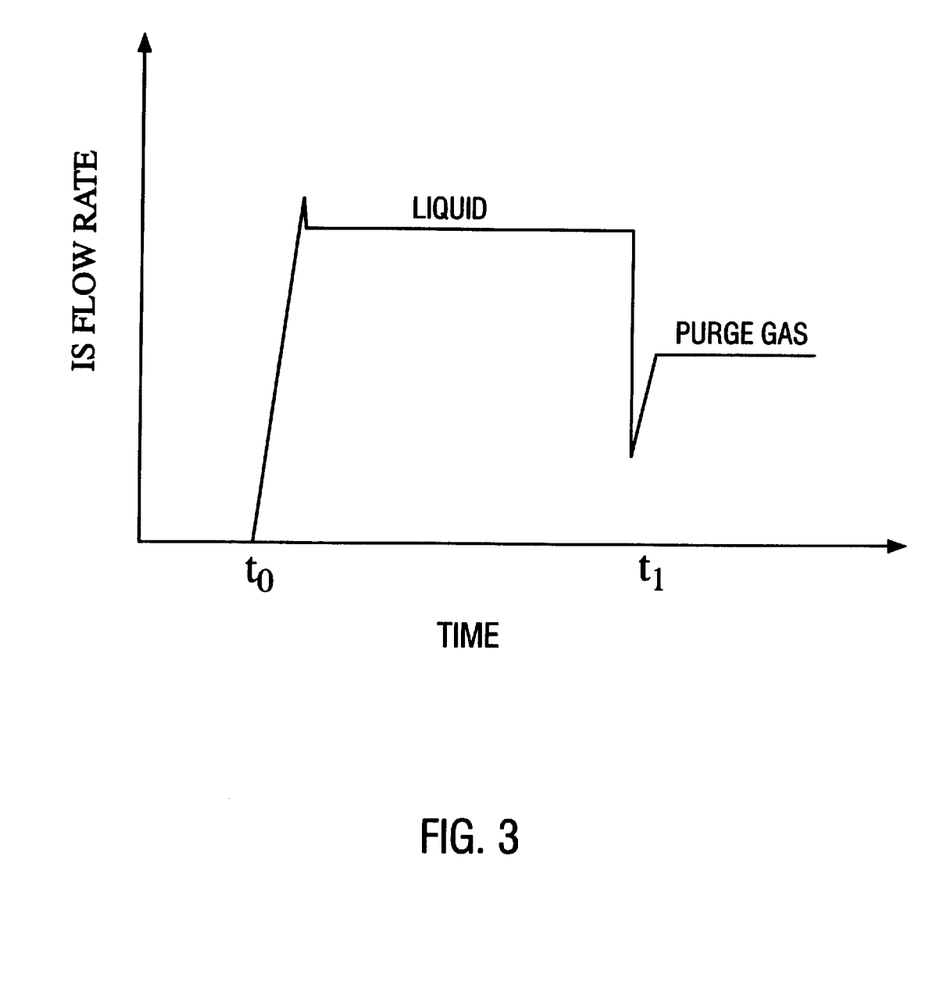
FIG. 3 is an illustrative plot of precursor liquid flow rate measurements in the liquid flow meter as a function of time.

If the liquid precursor inlet valve 64 is closed and the purge valve 74 is opened, the purge gas pushes the liquid precursor trapped in the purge line 76 through the liquid flow meter 60 and injection control valve 66 to the vaporizer 68. As the purge gas pushes the trapped liquid precursor, a liquid-gas boundary is formed between the purge gas and the liquid precursor. When the trapped liquid precursor is completely evacuated or drained from the purge line, the liquid-gas boundary crosses the liquid flow meter 60. Because the purge gas has a density substantially lower than the density of the liquid precursor, the liquid flow meter 60 senses a sharp spike which results from the sudden drop in density of the fluid passing through the liquid flow meter at an end time $t_1$, as seen in FIG. 3. Different types of liquid flow meters 60 will detect the spike in different way. As the liquid-gas boundary passes through the liquid flow meter 60, the heat transfer detected takes a sharp drop suddenly, which reflects a sudden drop in mass flow rate.

After a transient period, the IS mass flow rate settles at another steady rate for the purge gas which is lower than the mass flow rate of the liquid precursor. The chamber inlet 30 is desirably closed and the bypass valve is desirably opened during the flows of the carrier gas, liquid precursor, and purge gas through the vaporizer 68 to guide the release of the flows away from the chamber 12. This configuration prevents the chamber 12 from being contaminated by the process gases.

The actual mass liquid flow rate of the trapped liquid precursor is $$Q_a = M/t_a, \qquad (2)$$

where $t_a$ is the actual elapsed time with $t_a = t_1 - t_0$. The flow rate setting of the liquid flow meter 60, which is $Q_e$, will generally be different from $Q_a$ due to inaccuracies of the liquid flow meter 60. If the liquid flow meter 60 were inaccurate, the expected elapsed time $t_e$ for evacuating the mass m of the liquid precursor should be $$t_e = M/Q_e. \qquad (3)$$

The correction or calibration factor C is $$C = Q_a/Q_e = t_e/t_a. \qquad (4)$$

The correction factor C is used to compensate for the inaccuracies of the liquid injection system 18 which produces an actual elapsed time $t_a$ even though the liquid injection system is set at an intended or expected or reference liquid precursor flow rate $Q_e$. As noted above, the actual measured flow rate in reality is $Q_a$ instead of $Q_e$ due to system inaccuracies. A calibration procedure using the expected liquid precursor flow rate $Q_e$ and avoiding system inaccuracies produces the expected or reference elapsed time $t_e$. The correction factor C is computed from $t_a$ and $t_e$. The actual liquid flow rate $Q_a$ can be obtained by multiplying $Q_e$ by C. In order to achieve a corrected measured liquid flow rate $Q_c$ equal to the expected liquid flow rate $Q_e$, the liquid injection system must be reset from $Q_e$ to a reset liquid flow rate $Q_r$, where $$Q_r = Q_e/C. \qquad (5)$$

C. Liquid Flow Rate Estimation & Verification

The liquid injection system 18, and more specifically the liquid flow meter 60, is pre-calibrated during factory production to an accuracy of within about 10% of the desirable calibration requirements. Using the purge line 76 in conjunction with the remaining components of the liquid injection system 18 of FIG. 2, the direct liquid measurement methodology is applied to calibrate the liquid injection system 18 and reduce the calibration tolerance from 10% to a much lower preset value.

The application of the direct liquid measurement calibration methodology comprises primarily three stages. In the initialization stage, the expected elapsed time $t_e$ is computed using measurements made with the expected liquid flow rate $Q_e$. The actual elapsed time $t_a$ is then obtained by setting the factory calibrated liquid flow meter 60 to $Q_e$. The expected elapsed time and actual elapsed time are used to estimate the correction factor C in the estimation step. Alternatively, the correction factor C can be computed using $Q_a$ and $Q_e$, where $Q_e$ is equal to the flow rate setting of the factory calibrated liquid flow meter 60 and the actual liquid flow rate $Q_a$ is obtained by measuring the actual elapsed time $t_a$ and computing $Q_a = m/t_a$. This approach eliminates the need for the initialization step.

In the verification stage, the reset liquid flow rate $Q_r$ is computed and used to reset the liquid flow meter 60 if C deviates from 1 by a percentage greater than the required tolerance. A new $t_a$ or $Q_a$ is computed based on measurements obtained by resetting the liquid flow meter 60 to $Q_r$ and is used to compute a new correction factor C (using $C = t_e/t_a$ or using $C = Q_a/Q_e$). If C falls within the required tolerance, the calibration process is completed. If C falls outside the required tolerance, the new correction factor C is used to compute a new reset liquid flow rate $Q_r$ and the verification procedure is repeated until C falls within the required tolerance. Throughout this procedure, the chamber inlet valve 30 is closed and the bypass valve 28 is opened to prevent the gases from entering the process chamber 12.

1. Initialization

The initialization process generates a precise liquid flow rate equal to the expected flow rate $Q_e$ of the liquid precursor to evacuate the purge line 76. One method of accomplishing the expected flow rate $Q_e$ is to pre-calibrate the liquid flow meter 60, e.g., by bench calibration. In a bench calibration process, a steady flow of a liquid of a known mass is passed through the liquid flow meter 60. The time for the liquid to pass through the liquid flow meter 60 is measured. The expected flow rate is equal to the mass divided by the time measured. The expected flow rate is compared with the measured flow rate shown or displayed on the liquid flow meter 60. If the two flow rates are not equal, the liquid flow meter 60 is adjusted until the displayed flow rate reading is equal to the expected flow rate. The pre-calibrated liquid flow meter 60' is used in the liquid injection system 18 for the initialization procedure and the controller 80 is used to manage the flow circuit of the processing system 10.

The first step of the initialization process is to measure an expected elapsed time $t_e$ for evacuating or draining a known mass of trapped liquid precursor in the purge line 76 using the purge gas flow generated from the purge inlet 72. The purge valve 74 and injection control valve 66 are closed and the liquid precursor inlet valve 64 is opened to supply and trap the liquid precursor in the purge line 76. At the expected start time $t_{e0}$, the controller 80 sends a signal to close the liquid precursor inlet valve 64 and open the purge valve 74 to supply the purge gas to the purge line 76 at a generally steady rate.

The controller 80 communicates with the pre-calibrated liquid flow meter 60' to receive the liquid flow meter setting and adjusts the injection control valve 66 accordingly to achieve the target liquid flow rate of the liquid precursor exiting the purge line 76. The controller 80 also receives the liquid flow rate measurement data from the pre-calibrated liquid flow meter 60' and adjusts the injection control valve 66 based on the measured data in a feedback loop until the measured liquid flow rate matches the liquid flow meter setting in the pre-calibrated liquid flow meter 60'. This transient period advantageously lasts a very short time compared to the expected elapsed time $t_e$ for evacuating the trapped liquid precursor from the purge line 76. The size of the purge line 76 can be selected to ensure that that the transient period does not materially affect the accuracy of the measurement of $t_e$. The mass liquid flow rate measurement of the pre-calibrated liquid flow meter 60' drops suddenly at the expected end time $t_{e1}$ when the trapped liquid precursor in the purge line 76 is evacuated. The flow rate then settles at a steady purge gas flow rate after $t_{e1}$. The controller 80 records the flow rate measurements of the pre-calibrated liquid flow meter 60' as a function of time from $t_{e0}$ to and past $t_{e1}$, and desirably displays the time-dependent or IS liquid flow rate data on a visual display (not shown). The expected elapsed time $t_e$ is computed as $t_e = t_{e1} - t_{e0}$.

Figure 4:
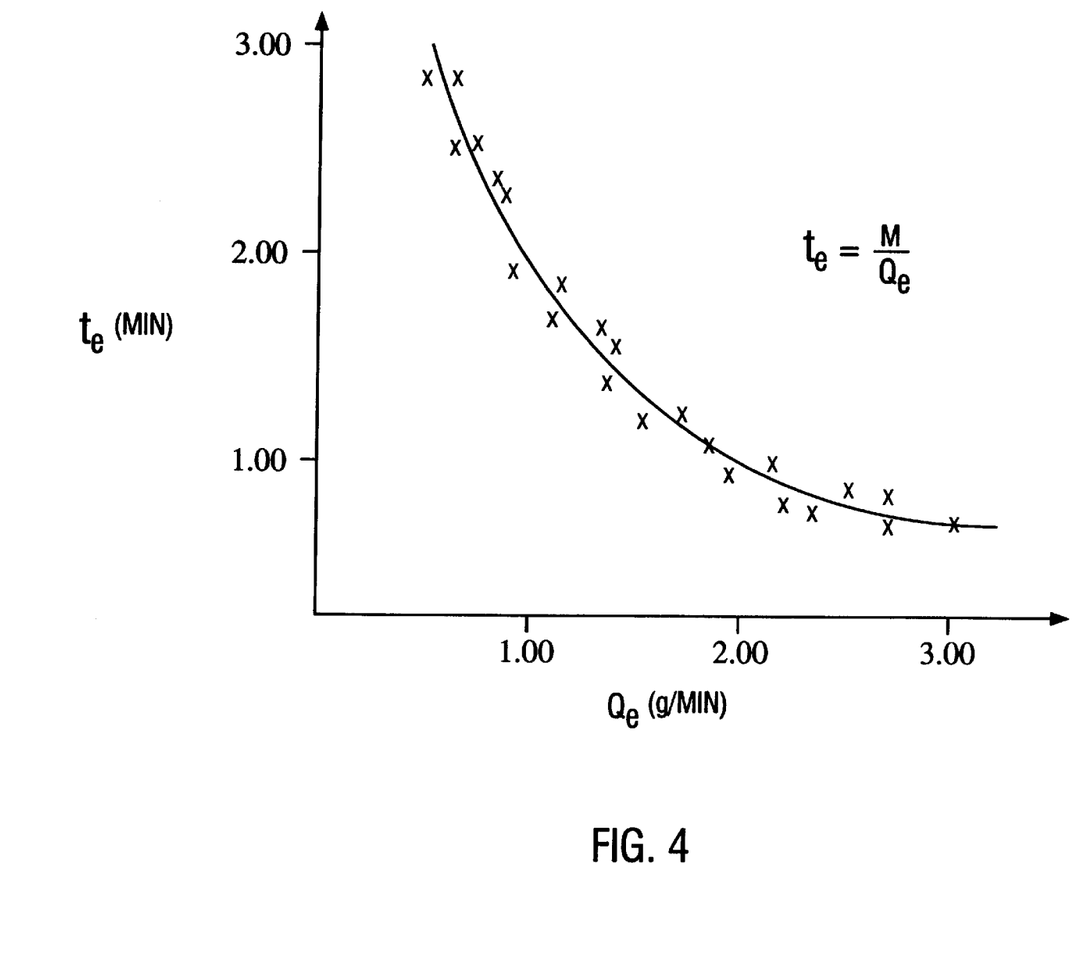
FIG. 4 is an illustrative plot of elapsed time for evacuating a known mass of liquid precursor in the purge line as a function of precursor liquid flow rate.

Because the operating liquid flow rate of the semiconductor wafer processing system 10 may vary for different processes, it is desirable to obtain the expected elapsed time values for a range of expected liquid flow rates. The above initialization process will thus be performed for a range of liquid flow meter settings $Q_e$ to obtain a range of $t_e$ values. An illustrative plot of $Q_e$ versus $t_e$ based on these values is shown in FIG. 4. Theoretically, the relationship between $Q_e$ and $t_e$ is inverse, but the empirical experimental values will deviate slightly from the inverse relationship. Thus, an estimated calibration curve is obtained which can be used for estimation and verification over a wide range of $Q_e$ values, such as the one shown in FIG. 4. For reliability, more than one pre-calibrated liquid flow meter 60' can be used to run the initialization process to obtain additional empirical values of $Q_e$ versus $t_e$ and a best fit calibration curve can be obtained by averaging the various empirical values. Although it is possible to establish a calibration curve based on two sets of empirical values obtained from two experiments, the reliability of such a calibration curve will be lower than that of a calibration curve obtained from a plurality of tests. The calibration curve is desirably stored in the controller 80 in the mathematical form of $t_e = M/Q_e$ where M is theoretically equal to the mass of the liquid precursor trapped in the purge line 76.

2. Estimation

The estimation stage is performed with the actual liquid flow meter 60 with a flow rate setting equal to the expected flow rate $Q_e$. To begin the process, the controller 80 closes the purge valve 74 and the injection control valve 66, and opens the liquid precursor inlet valve 64 to release the liquid precursor into the purge line 76, which also fills the region between the purge line 76 and the injection control valve 66. At time $t_0$, the controller 80 sends a signal to close the liquid precursor inlet valve 64 and open the purge valve 74 to release the purge gas into the purge line 76 at a generally steady rate.

The controller 80 communicates with the factory calibrated liquid flow meter 60 to receive the liquid flow meter setting equal to the expected flow rate $Q_e$ and adjusts the injection control valve 66 accordingly to achieve the target liquid flow rate. The controller 80 also receives the liquid flow rate measurement data from the liquid flow meter 60 and adjusts the injection control valve 66 based on the measured data in a feedback loop until the measured liquid flow rate matches the liquid flow meter setting in the liquid flow meter 60. This transient period advantageously lasts a very short time compared to the actual elapsed time $t_a$ for evacuating the trapped liquid precursor from the purge line 76. The size of the purge line 76 can be selected to ensure that that the transient period does not materially affect the accuracy of the measurement of $t_a$. The mass liquid flow rate measurement of the liquid flow meter 60 drops suddenly at $t_1$ when the trapped liquid precursor in the purge line 76 is evacuated. The flow rate then settles at a steady purge gas flow rate after $t_1$. The controller 80 records the flow rate measurements of the liquid flow meter 60 as a function of time from $t_0$ to and past $t_1$, and desirably displays the time-dependent or IS liquid flow rate data on the visual display. The actual elapsed time $t_a$ is computed as $t_a = t_1 - t_0$.

The controller 80 takes the two elapsed time $t_e$ and $t_a$ and computes the estimated correction factor $C = t_e/t_a$. The expected elapsed time $t_e$ may be taken from the actual data obtained in the initialization stage or estimated from the calibration curve of FIG. 4. Alternatively, $t_e$ may be extracted from the mathematical relationship $t_e = M/Q_e$ stored in the controller 80.

An alternative method of estimating the correction factor C eliminates the need for obtaining the expected elapsed time $t_e$ in the initialization step. The correction factor C is estimated using the relationship $C = Q_a/Q_e$, where $Q_e$ is the expected liquid flow rate that is equal to the liquid flow meter setting. The actual liquid flow rate $Q_a$ produced by the liquid flow meter 60 can be estimated as $Q_a = M/t_a$. The correction factor C can be estimated without the use of a pre-calibrated liquid flow meter 60' to obtain the expected elapsed time $t_e$ in the initialization step.

3. Verification

If the correction factor C deviates from 1 by a percentage larger than the required tolerance, the controller 80 uses C to compute a reset liquid flow rate $Q_r = Q_e/C$. In that case, the controller 80 sends a signal to the liquid flow meter 60 to adjust the setting from $Q_e$ to $Q_r$. With the reset liquid flow rate $Q_r$, the estimation process is repeated to obtain a new measured actual elapsed time $t_a$. The new $t_a$ is used to compute a new correction factor C. If C falls within the required tolerance, the calibration of the liquid injection system 18 is completed and the verification is terminated. If C falls outside the required tolerance, C is used to compute a new reset liquid flow rate $Q_r$ and the verification process is repeated until C falls within the required tolerance.

To illustrate the in-situ liquid flow rate estimation and verification procedure, an illustrative example is set forth as follows. Assuming an illustrative $t_e$ value of 1.00 minute for a $Q_e$ value of 2.00 g/min, and that the measured value for $t_a = 1.10$. Because $M = Q_e \bullet t_e = 2.00$ g, the actual flow rate $Q_a = M/t_a = 1.82$ g/min, even though the liquid flow meter 60 is set at 2.00 g/min. Note that the $t_e$ value can also be obtained from the calibration curve of FIG. 4. As a result, the correction factor $C = Q_a/Q_e = t_e/t_a = 0.91$, and the reset liquid flow rate $Q_r = Q_e/C = 2.20$ g/min. After resetting the liquid flow meter 60 from 2.00 g/min to 2.20 g/min, the new actual flow rate $Q_a$ should be approximately equal to $CQ_r = 0.91 \times 2.20$ g/min = 2.00 g/min, which is the intended liquid flow rate, and the new $t_a$ should be equal to $t_e$ (and $Q_a$ should equal $Q_e$) and the new C should be 1.00. If C does not equal to 1.00 or fall sufficiently close to 1.00 with an acceptable tolerance (e.g., 2%) due to system inaccuracies, then the new C is used to compute a new reset liquid flow rate $Q_r$ and the verification process is repeated until C falls within the required tolerance.

It will be understood that the above-described arrangements of apparatus and the methods therefrom are merely illustrative of applications of the principles of this invention and many other embodiments and modifications may be made without departing from the spirit and scope of the invention as defined in the claims.

What is claimed is:

1. A method for calibrating a liquid flow controller, comprising the steps of:

measuring an expected elapsed time for draining a mass of liquid through an inlet line connected to an inlet of a pre-calibrated liquid flow controller at an expected flow rate;

measuring an actual elapsed time for draining said mass of liquid through said inlet line connected to an inlet of a liquid flow controller set at said expected flow rate;

computing calibration information using said expected elapsed time and said actual elapsed time; and calibrating said liquid flow controller using said calibration information to achieve said expected flow rate of said liquid.

2. The method of claim 1, wherein said step of computing calibration information comprises calculating a correction factor for said liquid flow controller by dividing said expected elapsed time by said actual elapsed time.

3. The method of claim 2, wherein said step of calibrating said liquid flow controller comprises adjusting a flow rate setting of said liquid flow controller if said correction factor deviates from 1 by more than a desired preset percentage.

4. The method of claim 3, wherein said step of adjusting a flow rate setting of said liquid flow controller comprises resetting said liquid flow controller from said expected flow rate to a reset flow rate equal to said expected flow rate divided by said correction factor.

5. The method of claim 1, wherein said step of measuring said expected elapsed time comprises recording an expected start time for draining said mass of liquid, recording measured mass flow rate data sensed in said pre-calibrated liquid flow controller as a function of time, and observing a sudden drop in said measured mass flow rate at an expected end time, said expected elapsed time being equal to said expected end time minus said expected start time.

6. The method of claim 1, wherein said step of measuring an actual elapsed time comprises recording a start time for draining said mass of liquid, recording measured mass flow rate data sensed in said liquid flow controller as a function of time, and observing a sudden drop in said measured mass flow rate at an end time, said actual elapsed time being equal to said end time minus said start time.

7. The method of claim 1, wherein said step of measuring an expected elapsed time is performed with a control module which releases said mass of liquid into said inlet line and traps said liquid in said inlet line, directs an inert gas flow to drive said mass of liquid from said inlet line through said pre-calibrated liquid flow controller at an expected start time until said mass of liquid completely exits said inlet line at an expected end time, said expected elapsed time being equal to said expected end time minus said expected start time.

8. The method of claim 1, wherein said step of measuring an actual elapsed time is performed with a control module which releases said mass of liquid into said inlet line and traps said liquid in said inlet line, directs an inert gas flow to drive said mass of liquid from said inlet line at a start time through said liquid flow controller at a start time until said mass of liquid completely exits said inlet line at an end time, said actual elapsed time being equal to said end time minus said start time.

9. A method for calibrating a liquid flow meter in a precursor liquid injection system, said method comprising the steps of:

trapping a liquid precursor with a mass in a tube having an outlet connected to an inlet of a liquid flow meter;

supplying a purge gas to an inlet of said tube, said purge gas and said liquid precursor forming a liquid-gas boundary therebetween;

setting said liquid flow meter at an expected liquid precursor mass flow rate to release said trapped liquid precursor from said tube to flow through said inlet of said liquid flow meter with said liquid-gas boundary moving across said tube;

measuring an elapsed time for said liquid-gas boundary to reach said inlet of said liquid flow meter;

computing calibration information using said elapsed time; and calibrating said liquid flow meter using said calibration information.

10. The method of claim 9, wherein said step of computing calibration information comprises calculating an actual liquid precursor mass flow rate by dividing said mass by said elapsed time and computing a calibration factor for said liquid flow meter by dividing said actual liquid precursor mass flow rate by said expected liquid precursor mass flow rate.

11. The method of claim 10, wherein said step of calibrating said liquid flow meter comprises adjusting said liquid flow meter if said calibration factor deviates from 1 by more than a preset tolerance.

12. The method of claim 11, wherein said step of adjusting said liquid flow meter comprises resetting said liquid flow meter from said expected liquid precursor mass flow rate to a reset liquid precursor mass flow rate equal to said expected liquid precursor mass flow rate divided by said calibration factor.

13. The method of claim 9, wherein said step of trapping said liquid precursor comprises opening a liquid precursor inlet valve disposed between a liquid precursor supply and said tube, and said step of supplying said purge gas comprises closing said liquid precursor inlet valve and opening a purge valve disposed between a purge gas supply and said inlet of said tube.

14. The method of claim 9, wherein said step of measuring an elapsed time comprises monitoring measured liquid precursor mass flow rate in said liquid flow meter and observing a sudden drop of said measured liquid precursor mass flow rate at said elapsed time.

15. A method for controlling the flow of a liquid precursor into a deposition process chamber, said method comprising the steps of:

accumulating a liquid precursor in a line connected upstream to a liquid precursor controller;

directing a purge gas at a start time $t_0$ to drive said liquid precursor from said line through said liquid precursor controller at a liquid precursor flow rate, said liquid precursor drained from said line at an end time $t_1$;

generating control data from said start time and said end time; and controlling said liquid precursor flow rate to achieve an intended liquid precursor flow rate in response to said control data.

16. The method of claim 15, further comprising the step of determining an expected elapsed time prior to performing the aforementioned steps, said step of determining an expected elapsed time comprising:

accumulating said liquid precursor in said line connected upstream to a pre-calibrated liquid precursor controller;

directing a purge gas at an expected start time $t_{e0}$ to drive said liquid precursor from said line through said pre-calibrated liquid precursor controller at said intended liquid precursor flow rate, said liquid precursor drained from said line at an expected end time $t_{e1}$; and computing said expected elapsed time $t_e = t_{e1} - t_{e0}$.

17. The method of claim 16, wherein said step of determining an expected elapsed time is repeated for a plurality of intended liquid precursor flow rates to generate a plot of $t_e$ as a function of intended liquid precursor flow rate.

18. The method of claim 16, wherein said step of generating control data comprises computing a correction factor $C = (t_1 - t_0)/t_e$.

19. The method of claim 18, wherein said step of controlling said liquid precursor flow rate comprises adjusting said liquid precursor flow rate if C deviates from 1 by more than a preset percentage.

20. The method of claim 19, wherein said step of controlling said liquid precursor flow rate comprises resetting said liquid precursor flow rate to a reset liquid precursor flow rate which is equal to the intended liquid precursor flow rate divided by C.

21. The method of claim 15, wherein said step of directing said purge gas comprises setting said liquid precursor controller at said intended liquid precursor flow rate and opening a purge valve connected between a purge gas supply and an inlet of said line.

22. The method of claim 21, wherein said step of generating control data comprises calculating an actual liquid precursor flow rate by dividing the mass of said liquid precursor accumulated in said line by an elapsed time equal to said end time minus said start time, and computing a control factor for said liquid precursor controller by dividing said actual liquid precursor flow rate by said intended liquid precursor flow rate.

23. The method of claim 22, wherein said step of controlling said liquid precursor flow rate comprises adjusting said liquid precursor flow rate if said control factor deviates from 1 by more than a preset percentage.

24. The method of claim 23, wherein said step of adjusting said liquid precursor flow rate comprises resetting said liquid precursor flow rate of said liquid precursor controller from said intended liquid precursor flow rate to a reset liquid precursor flow rate equal to said intended liquid precursor flow rate divided by said control factor.

\* \* \* \* \*